United States Patent
Yu et al.

(10) Patent No.: US 11,489,508 B2
(45) Date of Patent: Nov. 1, 2022

(54) ELECTRONIC DEVICE AND METHOD FOR OPERATING THE SAME

(71) Applicant: Advanced Semiconductor Engineering, Inc., Kaohsiung (TW)

(72) Inventors: Yuanhao Yu, Kaohsiung (TW); Weifan Wu, Kaohsiung (TW); Tingyen Chang, Kaohsiung (TW); Mingjhih Tsai, Kaohsiung (TW); Fengchuan Tsai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/013,333

(22) Filed: Sep. 4, 2020

(65) Prior Publication Data
US 2022/0077837 A1    Mar. 10, 2022

(51) Int. Cl.
*H03H 7/38* (2006.01)
*H01Q 1/22* (2006.01)
*H04R 1/10* (2006.01)
*H04R 1/22* (2006.01)

(52) U.S. Cl.
CPC ............ *H03H 7/38* (2013.01); *H01Q 1/2283* (2013.01); *H04R 1/10* (2013.01); *H04R 1/22* (2013.01)

(58) Field of Classification Search
None
See application file for complete search history.

(56) References Cited

U.S. PATENT DOCUMENTS

| | | | |
|---|---|---|---|
| 8,543,176 B1* | 9/2013 | Daniel | H01Q 1/243 455/575.7 |
| 2004/0192406 A1* | 9/2004 | Okazaki | H04B 1/0458 455/569.1 |
| 2004/0242289 A1* | 12/2004 | Jellicoe | H01Q 1/242 455/575.1 |
| 2011/0076966 A1* | 3/2011 | Ishimiya | H04B 1/0458 455/78 |
| 2017/0279436 A1* | 9/2017 | Domino | H03H 11/28 |
| 2019/0103661 A1 | 4/2019 | Cousins et al. | |
| 2020/0045422 A1* | 2/2020 | Chiang | H04W 4/80 |
| 2020/0091588 A1* | 3/2020 | Zhao | H01Q 1/273 |

FOREIGN PATENT DOCUMENTS

WO    WO-2013005080 A1 *    1/2013    ............ H01Q 5/335

* cited by examiner

*Primary Examiner* — Anh Q Tran
(74) *Attorney, Agent, or Firm* — Foley & Lardner LLP (57) ABSTRACT

A wearable device and method for operating the same are provided. The wearable device includes an antenna element, a first matching circuit, a second matching circuit, and a switch element. The first matching circuit has a first impedance value. The second matching circuit has a second impedance value different from the first impedance value. The switch element is configured to determine whether the antenna element is electrically connected with the first matching circuit or the second matching circuit.

18 Claims, 6 Drawing Sheets

ELECTRONIC DEVICE AND METHOD FOR OPERATING THE SAME

BACKGROUND

1. Field of the Disclosure

The present disclosure relates to an electronic device and a method for operating the same, and more particularly to a wearable device including an antenna and a method for operating the same.

2. Description of the Related Art

Wearable devices have become very popular as more wireless communication techniques come out. The transmission efficiency of the wireless communication depends on the impedance matching between the antenna and the circuitry of the wearable devices. The external environment plays an important role of the impedance matching. However, current wearable devices cannot provide a good impedance matching under various environments.

SUMMARY

In some embodiments, a wearable device includes an antenna element, a first matching circuit, a second matching circuit, and a switch element. The first matching circuit has a first impedance value. The second matching circuit has a second impedance value different from the first impedance value. The switch element is configured to determine whether the antenna element is electrically connected with the first matching circuit or the second matching circuit.

In some embodiments, a method of operating an antenna module includes: generating a control signal; and determining whether an antenna is electrically connected with a first matching circuit or a second matching circuit in response to the control signal. The first matching circuit has an impedance value different from that of the second matching circuit.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
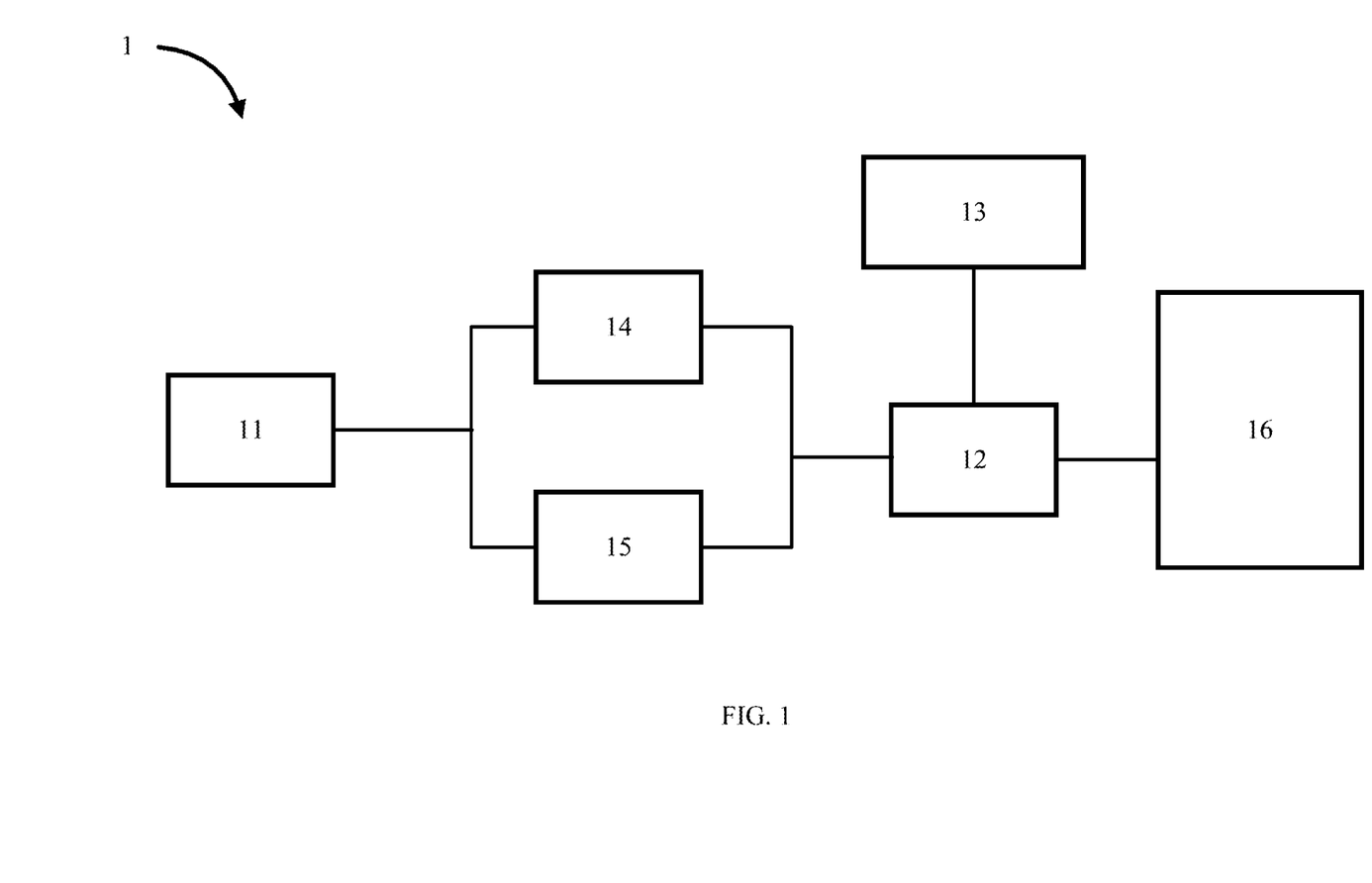
FIG. 1 illustrates a block diagram of an electronic device according to some embodiments of the present disclosure.

FIG. 1 illustrates a block diagram of an electronic device 1 according to some embodiments of the present disclosure. In some embodiments, the electronic device 1 may be or a part of an antenna module or a wearable device (e.g., an electronic watch, an electronic band, an electronic glasses, an earphone or the like). As shown, the electronic device 1 includes an antenna element 11, a switch element 12, a detecting element 13, matching circuits 14 and 15, and a processing element 16.

The antenna element 11 may be electrically connected to the matching circuit 14. The antenna element 11 may be electrically connected to the matching circuit 15. The switch element 12 may be electrically connected to the matching circuit 14. The switch element 12 may be electrically connected to the matching circuit 15. The detecting element 13 may be electrically connected to the switch element 12. The processing element 16 may be electrically connected to the switch element 12.

The antenna element 11 may be configured to receive electromagnetic waves from one or more external devices. The antenna element 11 may be configured to transmit electromagnetic waves to the external device. For example, the antenna element 11 may be configured to provide a wireless connection between the electronic device 1 and the external device. The antenna element 11 may be further configured to, in response to the electromagnetic waves received from the external device, provide one or more electrical signals (e.g., electrical current) to the processing element 16 through a matching circuit (e.g., the matching circuit 14 or the matching circuit 15) and the switch element 12. The antenna element 11 may be configured to receive one or more electrical signals (e.g., electrical current) from the processing element 16 through a matching circuit (e.g., the matching circuit 14 or the matching circuit 15) and the switch element 12. The antenna element 11 may be configured to radiate the energy of one or more received electrical signals as electromagnetic waves. In some embodiment, the antenna element 11 may include a feed portion configured receive and/or transmit an electrical signal. The feed portion may have a terminal connected to ground. In some embodiment, the antenna element 11 may include a monopole antenna, a chip antenna or the like.

The detecting element 13 may be configured to detect whether an external object is present near the electronic device 1. The external object may include, for example, a user's finger, head, or other body portions. The external object may have, for example, tissue fluid or electrically conductive fluid therein. The detecting element 13 may be configured to sense the contact between the external object and the electronic device 1. The detecting element 13 may be configured to determine whether a distance between the external object and the electronic device 1 is less than or equal a threshold distance. The detecting element 13 may be a sensing element. The sensing element may include, for example, a resistive sensor, a capacitive sensor, an inductive sensor, an optical sensor (e.g., infrared sensor), a sound sensor, or a proximity sensor.

The detecting element 13 is configured to generate a signal (or a control signal) and to send the signal to the switch element 12 depending on the detection result. For example, the detecting element 13 may be configured to generate a signal having a first logical value in the case that the external object is detected to be near the electronic device 1. For example, the detecting element 13 may be configured to generate a signal having a second logical value in the case that the external object is not detected (or is absent). The first logical value is different from the second logical value.

The switch element 12 is configured to receive the signal from the detecting element 13. The switch element 12 may be configured to determine whether the antenna element 11 is electrically connected with the matching circuit 14 or the matching circuit 15 based on the signal received from the detecting element 13. In some embodiment, when the connection between the antenna element 11 and the matching circuit 14 is established, the connection between the antenna element 11 and the matching circuit 15 is cut off, and vice versa. In some embodiments, the switch element 12 may include, for example, an electrical switch or a mechanical switch.

The matching circuit 14 may have a first impedance value. The matching circuit 15 may have a second impedance value different from the first impedance of the matching circuit 14. In some embodiments, the first impedance value may be greater than the second impedance value. Alternatively, the first impedance value may be less than the second impedance value. The matching circuit 14 may be electrically coupled to the antenna 11, for example, a feed portion of the antenna 11, when the switch element 13 connects the antenna element 11 with the matching circuit 14. The matching circuit 15 may be electrically coupled to the antenna 11, for example, a feed portion of the antenna 11, when the switch element 13 connects the antenna element 11 and the matching circuit 15. The matching circuit 15 is disconnected with the matching circuit 14.

The processing element 16 is configured to receive one or more electrical signal (e.g., electrical current) from the antenna 11 through the switch element 12 and the matching circuit 14 or the matching circuit 15. The processing element 16 may provide one or more electrical signals (e.g., electrical current) to the antenna 11. The processing element 16 may include, for example, a transmitter, a receiver, a processor, a multiplexer, a memory and the like. In some embodiments, the processing element 16 may control a speaker, a microphone, or a display (not shown).

The antenna element 11 may have a predetermined impedance value. The predetermined impedance value may be in a range from about 30 ohm to about 75 ohm. The predetermined impedance value may be about 50 ohm. Matching the predetermined impedance value of the antenna element 11 with the impedance value of a load terminal of the circuitry of the electronic device 1, for example, a transmitter or a receiver of the processing element 16, is very crucial to the wireless transmission efficiency. The impedance matching varies the resonant frequency of the antenna 11. If the resonant frequency of the antenna element 11 is within the desirable frequency band, the wireless transmission efficiency can be higher, i.e., the return loss (e.g., S11 parameter) of the antenna element 11 can be reduced. The desirable frequency band may indicate the frequency of the electromagnetic waves transmitted and/or received by the antenna element 11. In some embodiments, the desirable frequency band may be in a range from about 2.4 GHz to about 2.5 GHz. Therefore, using a matching circuit may create a better impedance matching between the antenna element 11 and the terminal of the circuitry of the electronic device 1.

Figure 2A:
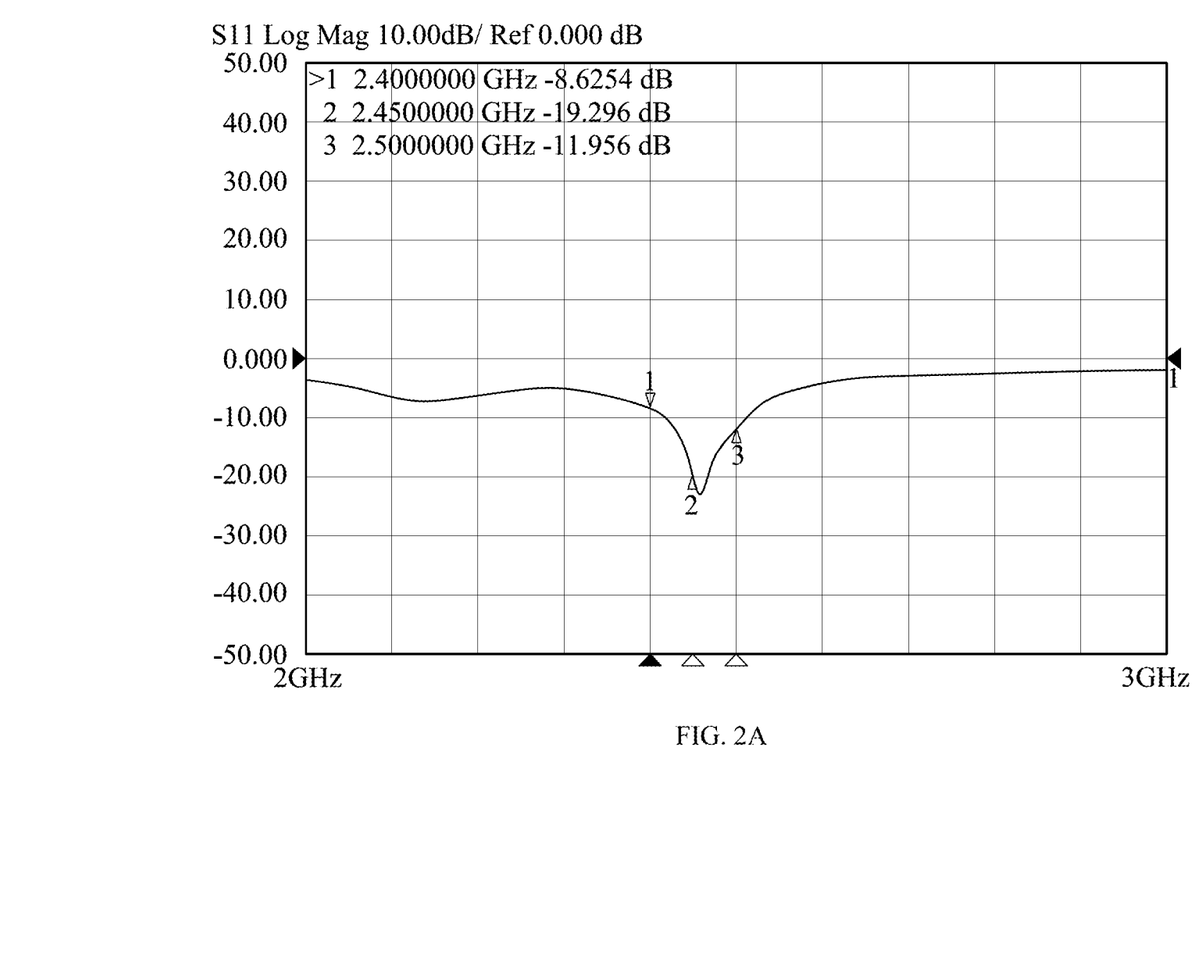
FIGS. 2A and 2B illustrate simulation results of an electronic device according to some embodiments of the present disclosure.
Figure 2B:
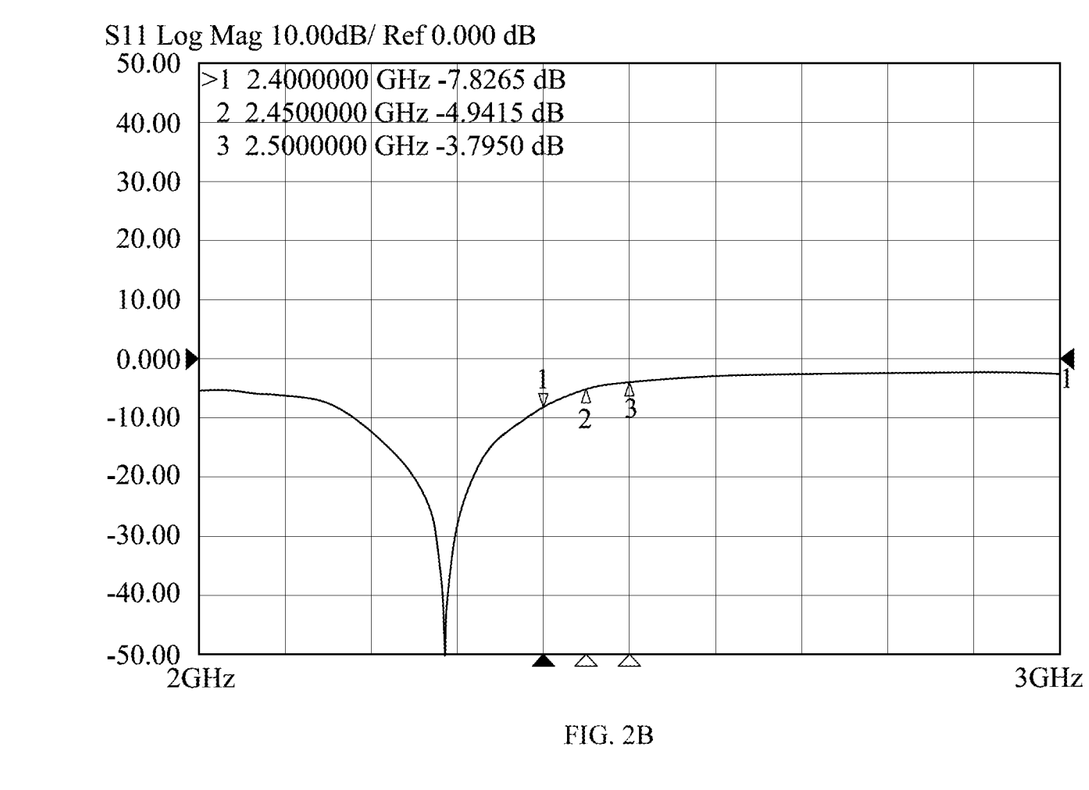

In comparative embodiments, an electronic component may include only one matching circuit, and a good impedance matching between the antenna element and the matching circuit can be acquired when the electronic component is placed in an environment, where no external object is present; however, in the case that the electronic device is in contact with or close to an external object, the equivalent impedance value of the antenna element would change, and an impedance mismatch between the antenna element and the matching circuit occurs, which would adversely affect the radiation performance of the antenna element. For example, the antenna element may operate at a resonant frequency within the desirable frequency band if a good impedance matching between the antenna element and the matching circuit is acquired. For example, the example transmission efficiency data of the antenna element as shown in FIG. 2A illustrates that the return loss (e.g., S11 parameter at 2.4 GHz, 2.45 GHz, and 2.5 GHz) is better than a specific decibel value within the desired frequency band. However, if the impedance mismatch between the antenna element and the matching circuit occurs, the antenna element would operate at a resonant frequency out of the desirable frequency band (e.g., frequency shift), which would increase the return loss of the antenna element and reduce the transmission efficiency of the antenna element. For example, the example transmission efficiency data of the antenna element as shown in FIG. 2B illustrates that the return loss (e.g., S11 parameter at 2.4 GHz, 2.45 GHz, and 2.5 GHz) is worse than a specific decibel value (e.g., −10 dB) within the desired frequency band. This will cause a shorter transmission distance, a higher transmission power and a higher latency.

In accordance with the embodiments as shown in FIG. 1, the electronic device 1 have two or more matching circuits 14, 15, and the switch element 12 can determine the antenna element 11 is electrically connected with the matching circuit 14 or the matching circuit 15 based on the signal from the detecting element 13. Hence, the electronic device 1 may ensure that the impedance matching between the antenna element 11 and the matching circuit (e.g., the matching circuit 14 or the matching circuit 15) can be acquired under different environments. For example, the impedance value of the antenna element 11 can match with the impedance value of the circuitry of the electronic device 1 through the matching circuit 14 if an external object is absent. The antenna element 11 may have a first resonant frequency within the desirable frequency band. For example, the impedance value of the antenna element 11 can match with the impedance value of the circuitry of the electronic device 1 through the matching circuit 15 if an external object is detected to be close to the electronic component 1. The antenna element 11 may have a second resonant frequency within the desirable frequency band. Although the first resonant frequency may be different from the second resonant frequency, both of them are within the desirable frequency band. Thus, regardless the change appears in the environment, the antenna element 11 of the electronic device 1 may operate at the resonant frequency (e.g., the first resonant frequency or the second resonant frequency) within the desirable frequency band, which would improve the transmission efficiency of the antenna element 11 (e.g., a longer transmission distance, a lower transmission power and a lower latency).

In other words, when the electronic device 1 is in positioned in a free space where no external object exists, the antenna element 11 of the electronic device 1 would generate the first resonant frequency. In the transient period when the external object approaches the electronic device 1 within a threshold distance, the antenna element 11 may generate a third resonant frequency different from the first frequency before the switch 12 of the electronic device 1 switches from the matching circuit 14 to the matching circuit 15. The third resonant frequency may be out of the desired frequency band. After the connection of the matching circuit 15 and the antenna element 11 is established, the antenna element 11 would generate the second resonant frequency.

In some comparative embodiments, an electronic device may include multiple antennae to sustain the transmission efficiency by switching one of the multiple antennae to another one. However, the multiple antennae occupy an enormous volume, which is not suitable for some applications (e.g., wearable devices). In the present disclosure, the electronic device 1 controls the antenna impedance matching by switching small-sized multiple matching circuits (e.g., the matching circuit 14 and the matching circuit 15, or more). Thus, the size of electronic device 1 can be reduced.

Figure 3:
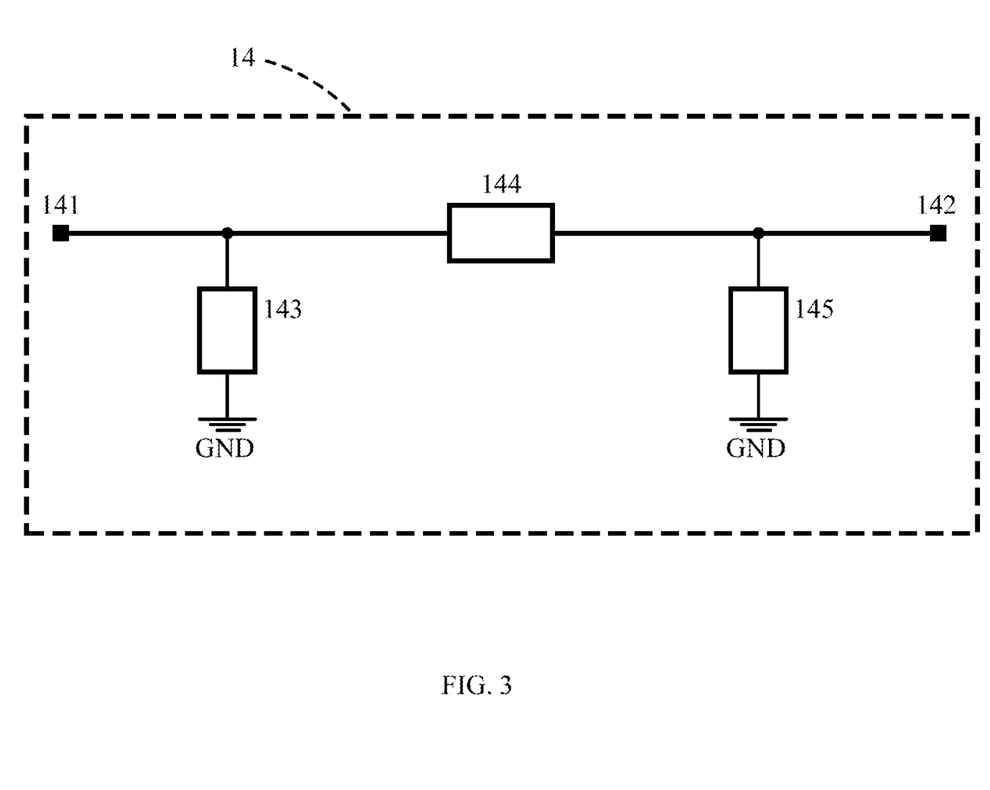
FIG. 3 illustrates a schematic diagram of a matching circuit according to some embodiments of the present disclosure.

FIG. 3 illustrates a schematic diagram of a matching circuit (e.g., the matching circuit 14) according to some embodiments of the present disclosure. As shown, the matching circuit 14 may include a first terminal 141, a second terminal 142, and electronic components 143, 144, and 145. The first terminal 141 may be electrically coupled to the antenna element 11 when the switch element 12 connects thereof. The second terminal 142 may be electrically connected to the processing element 16, for example, a transmitter or a receiver of the processing element 16.

The electronic component 143 may have a terminal electrically connected to the first terminal 141. The electronic component 143 may a terminal electrically connected to the electronic component 144. The electronic component 143 may a terminal electrically connected to ground. The electronic component 144 may have a terminal electrically connected to the first terminal 141. The electronic component 144 may a terminal electrically connected to the second terminal 142. The electronic component 144 may a terminal electrically connected to the electronic component 145. The electronic component 145 may have a terminal electrically connected to the second terminal 142. The electronic component 145 may a terminal electrically connected to ground. The electronic components 143, 144, and 145 may each include, for example, a capacitor, a resistor, an inductor, or the combination thereof. In some embodiments, the electronic components 143, 144, or 145 may include an inductor having an inductance value from about 1 nanohenry (nH) to about 7 nH. In some embodiments, the electronic components 143, 144, or 145 may include an inductor having an inductance value from about 3 nH to about 5 nH.

The matching circuit 15 may have a configuration similar to that of the matching circuit 14, except that the equivalent impedance value of the matching circuit 15 is different from that of the matching circuit 14. For example, the matching circuit 15 may include a first inductor and a second inductor. The inductance value of the first inductor may be different from that of the second inductor In some embodiments, the electronic components of the matching circuit (e.g., the matching circuit 14 or the matching circuit 15) can be determined through Smith Chart. With Smith Chart, the equivalent impedance value of the matching circuit and the circuitry of the electronic device (and the external object, if any) can be matched with the predetermined impedance value of the antenna element (e.g., 50 ohm) by adjusting the impedance value of the electronic components (including an inductor, a capacitor, or the combination of an indicator and a capacitor) of the matching circuit.

Figure 4:
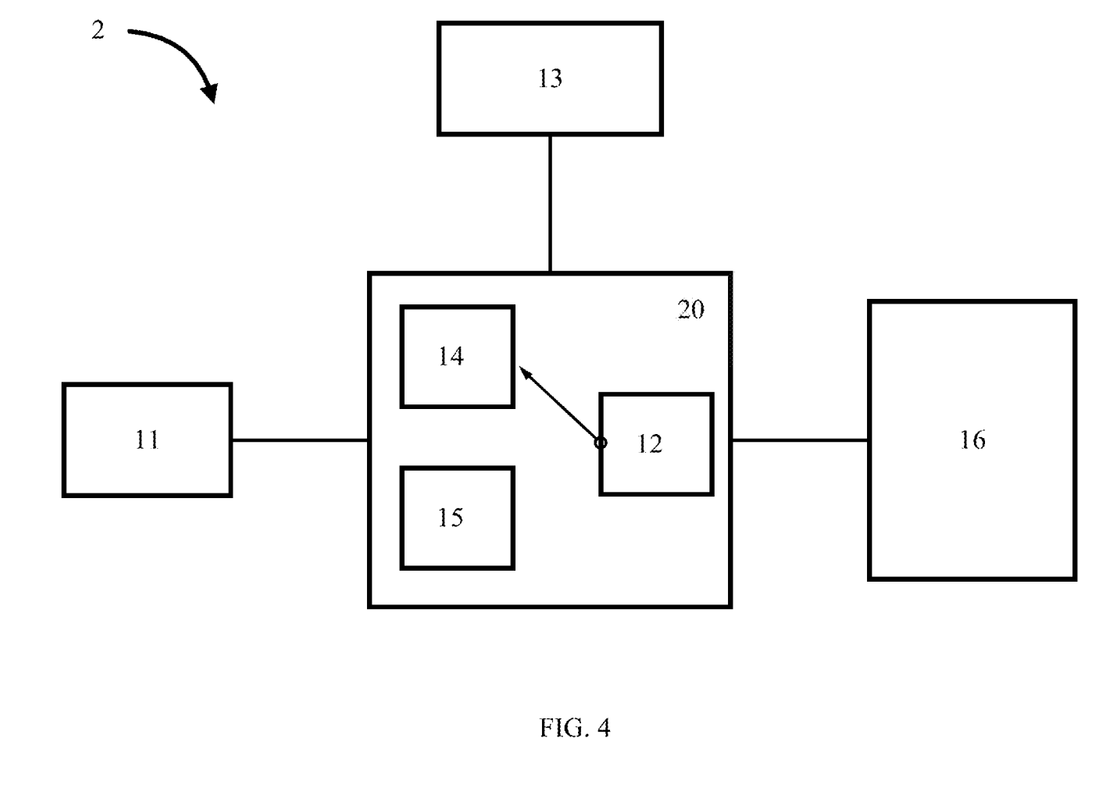
FIG. 4 illustrates a block diagram of an electronic device according to some embodiments of the present disclosure.

FIG. 4 illustrates a schematic diagram of an electronic device 2 according to some embodiments of the present disclosure. The electronic device 2 of FIG. 2 is similar to the electronic device 1 of FIG. 1, except that the switch element 12 and the matching circuits 14, 15 are integrated in an integrated circuit 20. Therefore, the size of electronic device 2 may be further reduced.

Figure 5:
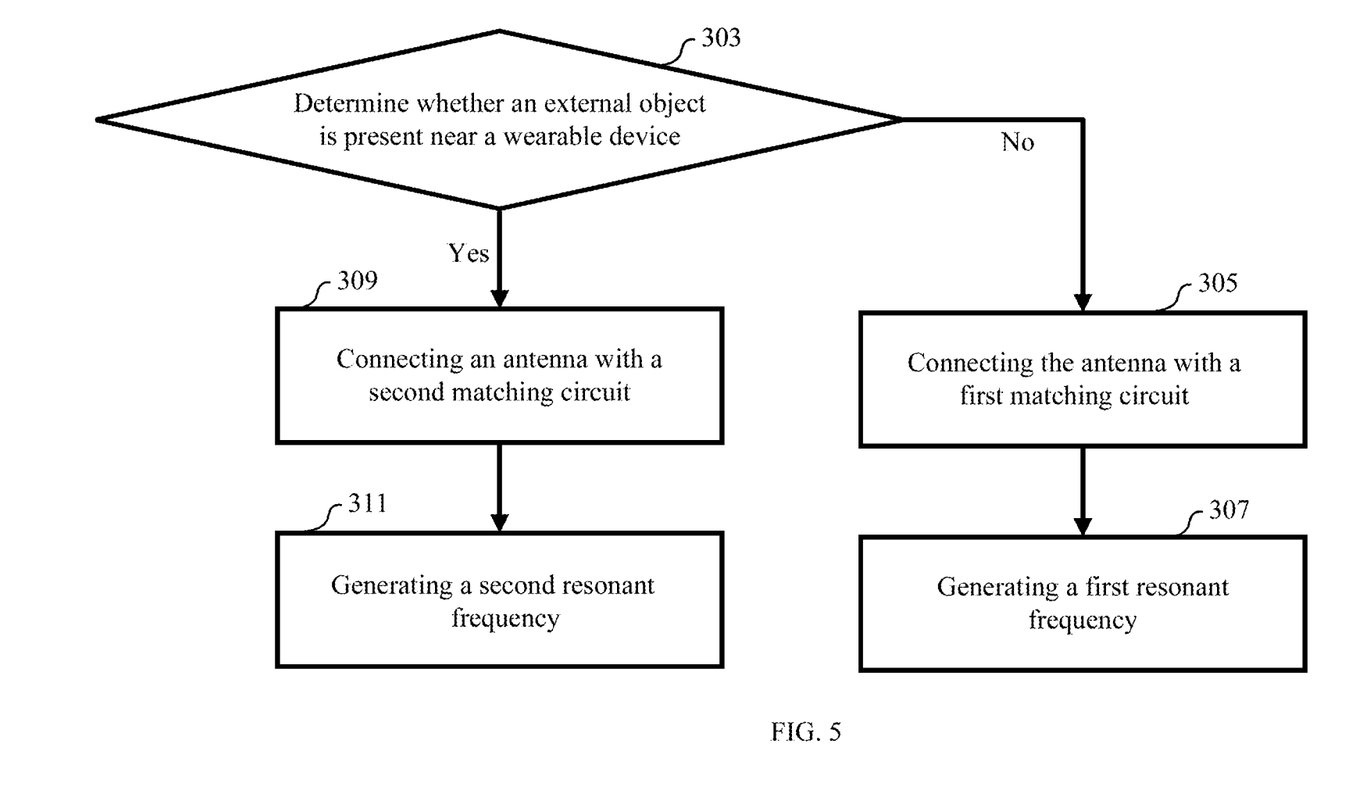
FIG. 5 illustrates a flow chart showing a method of operating an electronic device according to some embodiments of the present disclosure.

FIG. 5 illustrates a flow chart showing a method of operating an electronic device (e.g., the electronic device 1 or the electronic device 2) according to some embodiments of the present disclosure.

Step 303 includes, by using a detecting element (e.g., the detecting element 13), determining whether an external object is present near an electronic device. Step 303 may further include, by the detecting element, detecting whether an external object is present near the electronic device and generating a control signal according to detection result. Step 303 may further include determining whether an antenna element (e.g., the antenna element 11) is electrically connected with a matching circuit or another matching circuit (e.g., the matching circuit 14 or the matching circuit 15) in response to the control signal. The matching circuit may have an impedance value different from that of the other matching circuit. In some embodiments, the control signal may have a first logical value if the external object is absent near the electronic device and a second logical value if the external object is present. The first logical value may be different from the second logical value. If no external object is detected, the operation may be forward to Step 305. If an external object is detected, the operation may be forward to Step 309.

Step 305 includes, by using a switch element (e.g., the switch element 13), connecting the antenna with a matching circuit (e.g., the matching circuit 14). In some embodiments, connecting the antenna with the matching circuit includes connecting the antenna with the matching circuit when the switch element is received the control signal with the first logical value.

Step 307 includes generating a first resonant frequency by the antenna element. The first resonant frequency may be within a desirable frequency band.

Step 309 includes, by using the switch element (e.g., the switch element 13), connecting the antenna with another matching circuit (e.g., the matching circuit 15). In some embodiments, connecting the antenna with the other matching circuit includes connecting the antenna with the other matching circuit when the switch element is received the control signal with the second logical value.

Step 311 includes generating a second resonant frequency by the antenna element. The second resonant frequency may be substantially within a desirable frequency band. The first resonant frequency and the second resonant frequency are different. Furthermore, Step 311 may further include generating a third resonant frequency different from the first resonant frequency before generating the second resonant frequency when a distance between the antenna module and the external object is equal or less than a threshold distance.

By performing the method as shown in FIG. 5, the antenna element of the electronic device may operate at the resonant frequency (e.g., the first resonant frequency or the second resonant frequency) within the desirable frequency band regardless the change appears in the environment. The good transmission efficiency, e.g., the return loss, can be sustained in various conditions, which would improve the transmission efficiency of the antenna element (e.g., a longer transmission distance, a lower transmission power and a lower latency).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method of operating an antenna module, comprising:
generating a first resonant frequency by connecting an antenna element with a first matching circuit when a distance between an external object and the antenna module is greater than a threshold distance; and
generating a second resonant frequency different from the first resonant frequency when the antenna element is connected with the first matching circuit and about to be connected to a second matching circuit.

2. A wearable device, comprising:
an antenna element;
a first matching circuit;
a second matching circuit;
a switch element configured to determine whether the antenna element is electrically connected with the first matching circuit or the second matching circuit,
wherein the antenna element has a first resonant frequency when electrically connected with the first matching circuit and a second resonant frequency when electrically connected with the second matching circuit, and
wherein the first resonant frequency and the second resonant frequency are substantially within a first range; and
a detecting element that is not integrated with the antenna element, wherein the first matching circuit and the second matching circuit are integrated in an integrated circuit, and wherein the detecting element is not integrated into the integrated circuit,
wherein the detecting element is electrically connected to the switch element and configured to determine whether a distance between an external object and the wearable device is less than or equal a threshold distance.

3. The wearable device of claim 2, wherein the switch element is integrated into the integrated circuit.

4. A wearable device, comprising:
an antenna element;
a first matching circuit;
a second matching circuit; and
a switch element configured to determine whether the antenna element is electrically connected with the first matching circuit or the second matching circuit,
wherein the antenna element has a first resonant frequency when electrically connected with the first matching circuit and a second resonant frequency when electrically connected with the second matching circuit, wherein the first resonant frequency and the second resonant frequency are substantially within a first range, wherein the antenna element has a third resonant frequency temporarily when electrically connected with the first matching circuit and about to be switched to be electrically connected to the second matching circuit, and wherein the third resonant frequency is different from the first frequency and the second frequency.

5. A wearable device, comprising:
an antenna element;
a first matching circuit;
a second matching circuit;
a switch element configured to determine whether the antenna element is electrically connected with the first matching circuit or the second matching circuit, and
wherein the antenna element has a first resonant frequency when electrically connected with the first matching circuit and a second resonant frequency when electrically connected with the second matching circuit,
wherein the first resonant frequency and the second resonant frequency are substantially within a first range,
a detecting element that is not integrated with the antenna element, wherein
the first matching circuit and the second matching circuit are integrated in an integrated circuit, and the detecting element is not integrated into the integrated circuit,
the first resonant frequency and the second resonant frequency are different from each other,
a return loss of the antenna element is equal to or less than 10 dB when operating in a range from about 2.4 GHz to about 2.5 GHz,
the antenna element has a third resonant frequency temporarily when electrically connected with the first matching circuit and about to be switched to be electrically connected to the second matching circuit, and the third resonant frequency is different from the first frequency and the second frequency,
the first matching circuit includes a first inductor, a capacitor, and a second inductor,
the capacitor has a first terminal and a second terminal, and
the first inductor and the second inductor each has a first terminal electrically connected to ground and a second terminal electrically connected to the first terminal and the second terminal of the capacitor, respectively.

6. A wearable device, comprising:
an antenna element;
a first matching circuit having a first impedance value;
a second matching circuit having a second impedance value less than the first impedance value; and
a switch element configured to connect the antenna element with the first matching circuit when a distance between an external object and the wearable device is greater than a threshold distance and to connect the antenna element with the second matching circuit when the distance between the external object and the wearable device is equal to or less than the threshold distance.

7. The wearable device of claim 6, further comprising a detecting element that is not integrated with the antenna element, wherein the first matching circuit and the second matching circuit are integrated in an integrated circuit, and wherein the detecting element is not integrated into the integrated circuit.

8. The wearable device of claim 7, wherein the detecting element is electrically connected to the switch element and configured to determine whether the distance between the external object and the wearable device is less than or equal a threshold distance.

9. The wearable device of claim 7, wherein the switch element is integrated into the integrated circuit.

10. The wearable device of claim 6, wherein
the first matching circuit includes a first inductor, a capacitor, and a second inductor,
the capacitor has a first terminal and a second terminal, and
the first inductor and the second inductor each has a first terminal electrically connected to ground and a second terminal electrically connected to the first terminal and the second terminal of the capacitor, respectively.

11. The wearable device of claim 6, wherein
the antenna element has a first resonant frequency when electrically connected with the first matching circuit and a second resonant frequency when electrically connected with the second matching circuit, and
the first resonant frequency and the second resonant frequency are different from each other.

12. The wearable device of claim 6, wherein
the antenna element has a first resonant frequency when electrically connected with the first matching circuit,
the antenna element has a second resonant frequency temporarily when electrically connected with the first matching circuit and about to be switched to be electrically connected to the second matching circuit, and
the second resonant frequency is different from the first resonant frequency.

13. The wearable device of claim 6, further comprising a detecting element that is not integrated with the antenna element, wherein
the first matching circuit and the second matching circuit are integrated in an integrated circuit, and the detecting element is not integrated into the integrated circuit,
the antenna element has a first resonant frequency when electrically connected with the first matching circuit and a second resonant frequency when electrically connected with the second matching circuit,
the first resonant frequency and the second resonant frequency are different from each other,
the antenna element has a third resonant frequency temporarily when electrically connected with the first matching circuit and about to be switched to be electrically connected to the second matching circuit, and the third resonant frequency is different from the first frequency and the second frequency,
the first matching circuit includes a first inductor, a capacitor, and a second inductor,
the capacitor has a first terminal and a second terminal, and
the first inductor and the second inductor each has a first terminal electrically connected to ground and a second terminal electrically connected to the first terminal and the second terminal of the capacitor, respectively.

14. The method of claim 1, further comprising generating a third resonant frequency different from the first resonant frequency and the second resonant frequency by connecting the antenna element with the second matching circuit.

15. The method of claim 14, wherein the third resonant frequency is generated when the distance between the antenna module and the external object is equal to or less than the threshold distance.

16. The wearable device of claim 4, wherein the first resonant frequency and the second resonant frequency are different from each other.

17. The wearable device of claim 4, wherein a return loss of the antenna element is equal to or less than 10 dB when operating in a range from about 2.4 GHz to about 2.5 GHz.

18. The wearable device of claim 4, wherein
the first matching circuit includes a first inductor, a capacitor, and a second inductor,
the capacitor has a first terminal and a second terminal, and
the first inductor and the second inductor each has a first terminal electrically connected to ground and a second terminal electrically connected to the first terminal and the second terminal of the capacitor, respectively.

\* \* \* \* \*